(12) United States Patent
De et al.

(10) Patent No.: US 6,415,843 B1
(45) Date of Patent: Jul. 9, 2002

(54) SPATULA FOR SEPARATION OF THINNED WAFER FROM MOUNTING CARRIER

(75) Inventors: Bhola De, Congers, NY (US); Mark Spencer Grey, Somerset, NJ (US)

(73) Assignee: Anadigics, Inc., Warren, NJ (US)

( * ) Notice: Subject to any disclaimer, the term of this patent is extended or adjusted under 35 U.S.C. 154(b) by 44 days.

(21) Appl. No.: 09/756,849

(22) Filed: Jan. 10, 2001

(51) Int. Cl.$^7$ ................................................ B32B 35/00
(52) U.S. Cl. ....................... 156/584; 156/344; 15/236.01
(58) Field of Search ................................ 156/344, 584; 15/236.01, 236.02, 236.07, 236.08; D7/688; 294/7

(56) References Cited

U.S. PATENT DOCUMENTS

| | | | |
|---|---|---|---|
| 1,367,032 A | * 2/1921 | Ferdon .................... 15/236.01 |
| 2,639,454 A | * 5/1953 | Dory | |
| 2,813,054 A | * 11/1957 | Nicholas ........................ 112/2 |
| 3,887,996 A | 6/1975 | Hartleroad et al. ............ 29/583 |
| 4,239,567 A | 12/1980 | Winings ........................ 156/154 |
| 4,258,508 A | 3/1981 | Wilson et al. ............... 51/283 R |
| 4,496,180 A | 1/1985 | Hillman et al. ............ 294/64 R |
| 4,529,353 A | 7/1985 | Dean et al. .................. 414/786 |
| 4,584,045 A | 4/1986 | Richards ...................... 156/345 |
| 4,619,573 A | 10/1986 | Rathmann et al. .......... 414/222 |
| 4,661,196 A | 4/1987 | Hockersmith et al. ...... 156/345 |
| 4,690,724 A | * 9/1987 | Outlaw ........................ 156/344 |
| 4,790,045 A | * 12/1988 | Doherty .................... 15/236.01 |
| 4,836,733 A | 6/1989 | Hertel et al. ................ 414/225 |
| 4,867,631 A | 9/1989 | Warenback et al. ......... 414/786 |
| 4,875,824 A | 10/1989 | Moe et al. ................... 414/751 |
| 4,951,601 A | 8/1990 | Maydan et al. .............. 118/719 |
| 4,971,512 A | 11/1990 | Lee et al. .................. 414/744.8 |
| 4,984,954 A | 1/1991 | Warenback et al. ......... 414/416 |
| 5,091,042 A | * 2/1992 | Bruckner .................... 156/254 |
| 5,151,008 A | 9/1992 | Ishida et al. .............. 414/744.5 |
| 5,181,292 A | * 1/1993 | Aghachi ................... 15/236.05 |
| 5,226,523 A | 7/1993 | Kawakami et al. ......... 198/341 |
| 5,240,546 A | * 8/1993 | Shiga .......................... 156/350 |
| 5,301,429 A | * 4/1994 | Bundy ....................... 15/236.01 |
| 5,308,431 A | 5/1994 | Maher et al. ................ 156/345 |
| 5,310,442 A | 5/1994 | Ametani ...................... 156/353 |
| 5,368,678 A | * 11/1994 | Miyamoto et al. ........ 156/405.1 |
| 5,418,190 A | 5/1995 | Cholewa et al. ............. 437/226 |
| 5,445,486 A | 8/1995 | Kitayama et al. ........... 414/416 |
| 5,479,108 A | 12/1995 | Cheng .......................... 324/765 |
| 5,480,507 A | * 1/1996 | Arnold ........................ 15/93.1 |
| 5,482,899 A | 1/1996 | McKenna et al. .......... 437/225 |
| 5,498,305 A | * 3/1996 | Mailloux ...................... 156/249 |
| 5,730,574 A | 3/1998 | Adachi et al. .............. 414/222 |
| 5,746,460 A | 5/1998 | Marohl et al. ................ 294/1.1 |
| 5,766,360 A | 6/1998 | Sato et al. ................... 118/666 |
| 5,785,796 A | 7/1998 | Lee ............................. 156/345 |

(List continued on next page.)

Primary Examiner—Mark A. Osele
(74) Attorney, Agent, or Firm—Pennie & Edmonds LLP

(57) ABSTRACT

A wafer removing spatula has a handle connected to a tray. A shaft of the handle is provided with a pair of support guides and the tray is provided with a wafer support surface which rests on a tray support surface. The support guides and the tray support surface are configured and dimensioned to ensure that the wafer support surface is substantially parallel to the upper surface of a base plate on which both the support guides and the tray support surface rest. A front edge of the wafer support surface is provided with a bevel to facilitate lifting a wafer from a wafer carrier surface. The height of the lowermost portion of the front edge is approximately the same as the height of a wafer carrier placed on the base plate. During operation, the spatula is moved on the base plate towards the carrier with the wafer mounted thereon. The front edge of the spatula eases just above the upper surface of the wafer carrier such that the beveled edge creates and then enters a separation gap between the wafer and the wafer carrier, thereby causing the wafer to separate from the wafer carrier and climb onto the wafer support surface.

11 Claims, 4 Drawing Sheets

U.S. PATENT DOCUMENTS

| | | | |
|---|---|---|---|
| 5,810,935 A | 9/1998 | Lee et al. | 118/728 |
| 5,827,394 A | 10/1998 | Lu | 156/344 |
| 5,865,670 A | 2/1999 | Frank et al. | 451/339 |
| 5,895,270 A | 4/1999 | Hempel | 438/692 |
| 5,897,743 A * | 4/1999 | Fujimoto et al. | 156/344 |
| 5,900,105 A | 5/1999 | Toshima | 156/345 |
| 5,981,399 A | 11/1999 | Kawamura et al. | 438/715 |
| 5,988,971 A | 11/1999 | Fossey | 414/416 |
| 6,007,675 A | 12/1999 | Toshima | 156/345 |
| 6,017,820 A | 1/2000 | Ting et al. | 438/689 |
| 6,026,561 A | 2/2000 | Lafond | 29/722 |
| 6,053,688 A | 4/2000 | Cheng | 414/416 |
| 6,077,383 A * | 6/2000 | Laporte | 156/344 |
| 6,227,276 B1 * | 5/2001 | Kim et al. | 156/247 |
| 6,263,941 B1 * | 7/2001 | Bryan et al. | 156/239 |

* cited by examiner

SPATULA FOR SEPARATION OF THINNED WAFER FROM MOUNTING CARRIER

TECHNICAL FIELD

The present invention is directed to the field of equipment and accessories for processing semiconductor wafers. More particularly, it is directed to a device which is used to facilitate demounting a semiconductor wafer which has been adhesively mounted to a carrier disc used for support during a manufacturing operation.

BACKGROUND OF THE INVENTION

During semiconductor manufacture, a semiconductor wafer is placed on a carrier which provides mechanical support to the wafer, as the wafer is sent through various processing steps. An adhesive may be used to bond the wafer to the carrier to provide support while preventing slippage. Once the processing steps are over, a mechanical device may be used to debond and/or demount the wafer from the carrier. The prior art includes a number of devices that can be used to lift a wafer from a surface.

U.S. Pat. No. 5,479,108 to Cheng discloses a wand member attached to an end of a mechanical wafer pick. The wafer pick travels in a longitudinal direction in a plane substantially parallel to the surface of a chuck on which a wafer rests. The wand member slides under a wafer and rises to lift the wafer off of the surface of a chuck.

U.S. Pat. Nos. 4,984,954 and 4,867,631 to Warenback et al. disclose a spatula for wafer transport. The spatula contains a single major recess for receiving a wafer. Adjacent one edge of the recess is a shoulder for locating the wafer in the sequence of operations for loading the spatula. As a result of the sequence, the center of the wafer is held at a predetermined, known location.

U.S. Pat. No. 4,971,512 to Lee et al. discloses a transport device for handling wafers of different diameters. A robotic arm is equipped with a fork-shaped wafer support board and an arm slide movable relative to the robotic arm. The fork-shaped end of the support board is provided with fixed pins on one side to support wafers and on another side with plate springs carrying pins which can be depressed by the weight of a wafer to accommodate larger size wafers. The device permits wafers of different diameters accurately and safely to be transferred from its center to a predetermined station without the need for changing the wafer support board or correction of the robotic arm.

U.S. Pat. No. 4,875,824 to Moe et al discloses a transfer mechanism to pick up a wafer from one location, lift it, transfer it laterally, lower it and later deposit it another location. A horizontal feedscrew mounted in a stationary base controls horizontal reciprocation of a transverse housing. A vertical feedscrew mounted in the transverse housing controls vertical reciprocation of a second housing. Supported by the second housing are one or more lifts. Each lift has guide rods fixed relative to the second housing and a stop on its lower end. Parallel and adjacent the guide rods is a reciprocating rod carrying a gripper on its lower end. At the end of the vertical movement of the second housing the reciprocating rod moves the gripper away from the stop so that a wafer may rest on the guide rods. As the second housing moves up, the gripper clamps the wafer against the stop. Motors drive the feedscrews to lift the wafer, move it transversely and lower it. As it reaches the end of its lowering movement, the wafer is unclamped.

U.S. Pat. No. 4,619,573 to Rathmann et al. discloses a rail guided, magnetically driven shuttle plate. Baffles serve to isolate the particle producing portions of the mechanism from the wafers. The major drive components are located inside the rails and outside the vacuum containment system. A pin lift apparatus located on the reactor chucks serves to remove and replace wafers on the shuttle plate.

U.S. Pat. No. 4,496,180 to Hillman et al. discloses a vacuum operated apparatus is for releasably grasping and transporting a thin solid object or article (e.g. silicon semiconductor wafer). The apparatus has two fixed rigid arms joined together at their rear end to define a gap therebetween having an open end and a closed end wherein the upper arm directs the thin solid object into the gap and toward the lower arm having a port communicating with the gap and an enclosed passage way connected to a vacuum source. The device is provided with a plate fixed to the bottom of the lower arm. Silicon semiconductor wafers may be grasped and transported with the apparatus and more especially silicon semiconductor wafers can be deposited onto and removed from the surface of a barrel type susceptor of an epitaxial reactor with enhanced ease and reduced danger of scratching and breaking the wafer.

SUMMARY OF THE INVENTION

The wafer demount fixture of the present invention comprises a hand-held spatula specially configured to remove a brittle wafer from a carrier plate. The spatula is provided with at least one support guide slidably mounted therreon, the support guide permitting longitudinal movement of the spatula, when the support guide is fixed to a mounting surface. As the spatula moves in a longitudinal direction, a front edge of a wafer support surface of the spatula eases under a wafer, thereby lifting the wafer from a supporting carrier in a manner which minimizes chances of breaking the wafer. A handle member of the spatula is provided with a grip having an abutment surface configured to abut a base plate on which the spatula is mounted, thereby preventing the spatula from being moved too far in the direction of the wafer.

BRIEF DESCRIPTION OF THE DRAWINGS

The present invention can better be understood through the attached figures in which:

FIG. 2a shows a side view of the spatula, wafer and carrier of FIG. 1;

FIG. 2b shows the detail indicated in FIG. 2a;

DETAILED DESCRIPTION OF THE INVENTION

Figure 1:
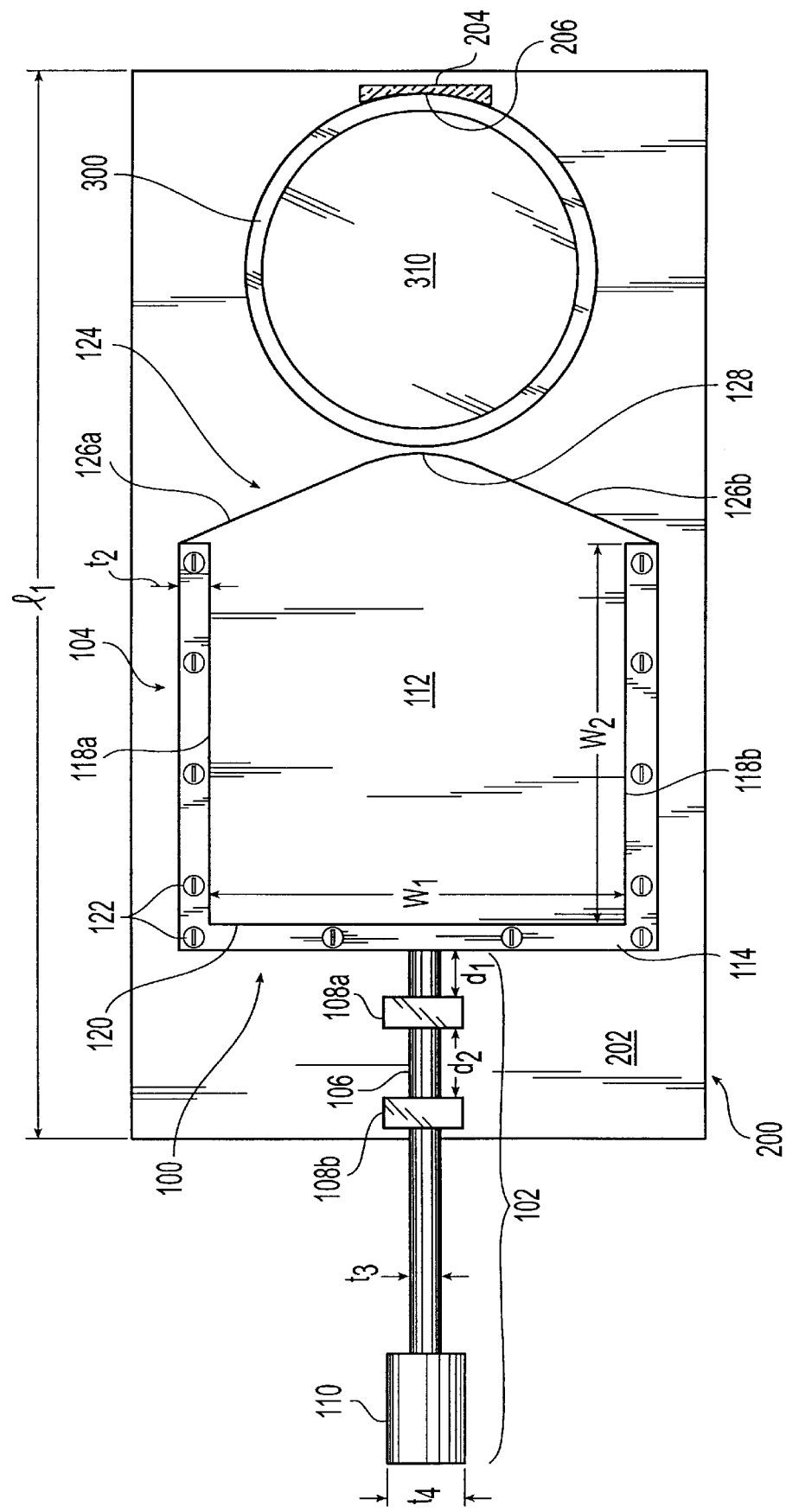
FIG. 1 shows a plan view of a spatula, semiconductor wafer and carrier in accordance with the present invention, prior to a demounting step.

FIGS. 1–4 show a plan view and a side view of a spatula 100 in accordance with the present invention resting on a base plate 200. The spatula 100 includes an elongated handle 102 connected at a first handle end to a tray 104.

The base plate 200, which is preferably formed from aluminum is provided with an mounting surface 202 on which the spatula 100 may rest or slide, as operated by the user. The base plate has a thickness t1 which, preferably is between 1.0–2.0 inches and more preferably is about 1.5 inches. The length l1 of the base plate preferably is about 22 inches. A first end of the base plate is provided with an upstanding base plate stop 204 having a height h4 which, in a preferred embodiment is between 1.75–2.25 mm, and more preferably is about 2 mm. The stop 204 has a concave inner surface 206 which substantially matches the outer contour of the carrier 300. In a preferred embodiment, the concave inner surface 206 of the stop has a radius of curvature of between 75–85 mm, and more preferably between 79–80 mm, to accommodate a carrier having a like radius of curvature.

The handle 102 is provided with a shaft 106 and a thermally insulating grip 110 at a second handle end thereof. Preferably, the shaft 106 and the grip 110 have circular cross-sections, with the shaft 106 having a diameter t3 of about 0.25 inches and the grip 110 having a diameter t4 of about ¾ inches. The grip preferably is formed from bakelite, but can be formed from any thermally insulating material. When used in conjunction with the base plate, the lowermost portion of the grip 110 extends below the upper mounting surface 202 of the base plate. When the spatula is pushed in the direction of the base plate stop 204, the lowermost portion of the grip 110 abuts a back abutment side surface 208 formed on the baseplate, thereby preventing the apex 128 from running into the stop 204 and thus damaging the front edges of the wafer support surface 112.

As seen in the figures, the shaft 106 passes through a pair of spaced apart support guides 108a, 108b. Each of the support guides has a width of about ⅜ inches along the shaft 106, although other widths may also be suitable. As seen from FIGS. 1–4, the support guides each have a substantially square cross-section with a substantially flat bottom guide surface 109a, 109b, which abuts the upper mounting surface 202 of the base plate 200 to thereby support the handle end of the spatula 100 such that the shaft 106 and the wafer support surface 112 are substantially parallel to the upper mounting surface 202 of base plate 200. The clearance h1 between the handle shaft 106 and the upper mounting surface 202 of the base plate is approximately 1.5 mm, although this figure may be varied somewhat without departing from the present invention.

Figure 3:
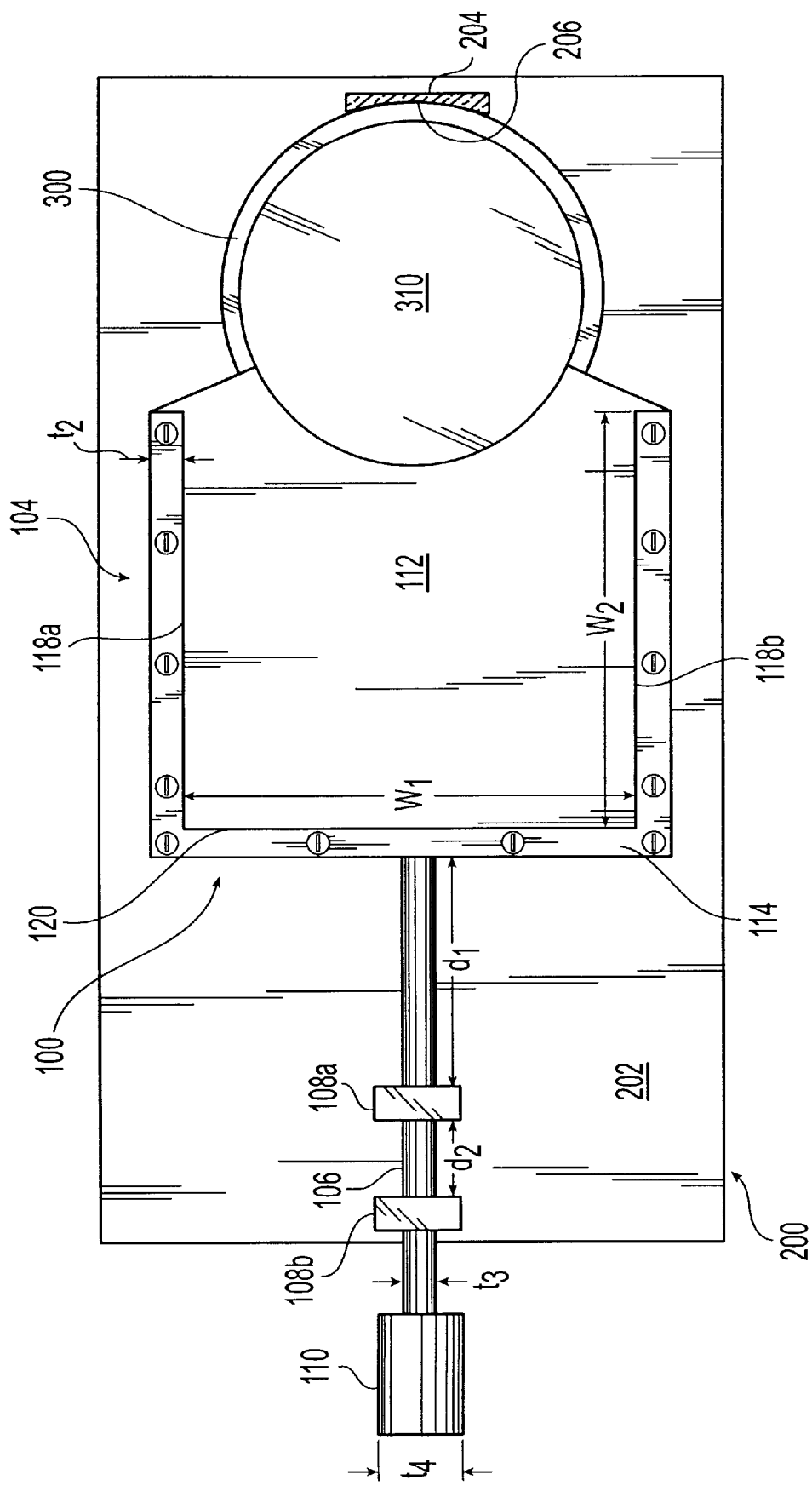
FIG. 3 shows a plan view of the spatula, semiconductor wafer and carrier of FIG. 1 during the demounting step.

As best seen in FIGS. 1 and 3, the first support guide 108a is spaced apart by a variable distance d1 from the tray and the second support guide 108b is spaced apart from the first support guide by a distance d2. Thus, the support guides are mounted on the base plate upper mounting surface 202 so as to permit longitudinal motion of the spatula along its shaft, and towards and away from the wafer. The support guides may thus be slidably fixed to the shaft and further be provided with mounts (not shown) to secure them to the upper surface 202. It should also be noted that while a pair of spaced apart support guides are shown, one may instead use a single, elongated support guide which is properly aligned, when mounted to the upper surface 202.

Figure 2:
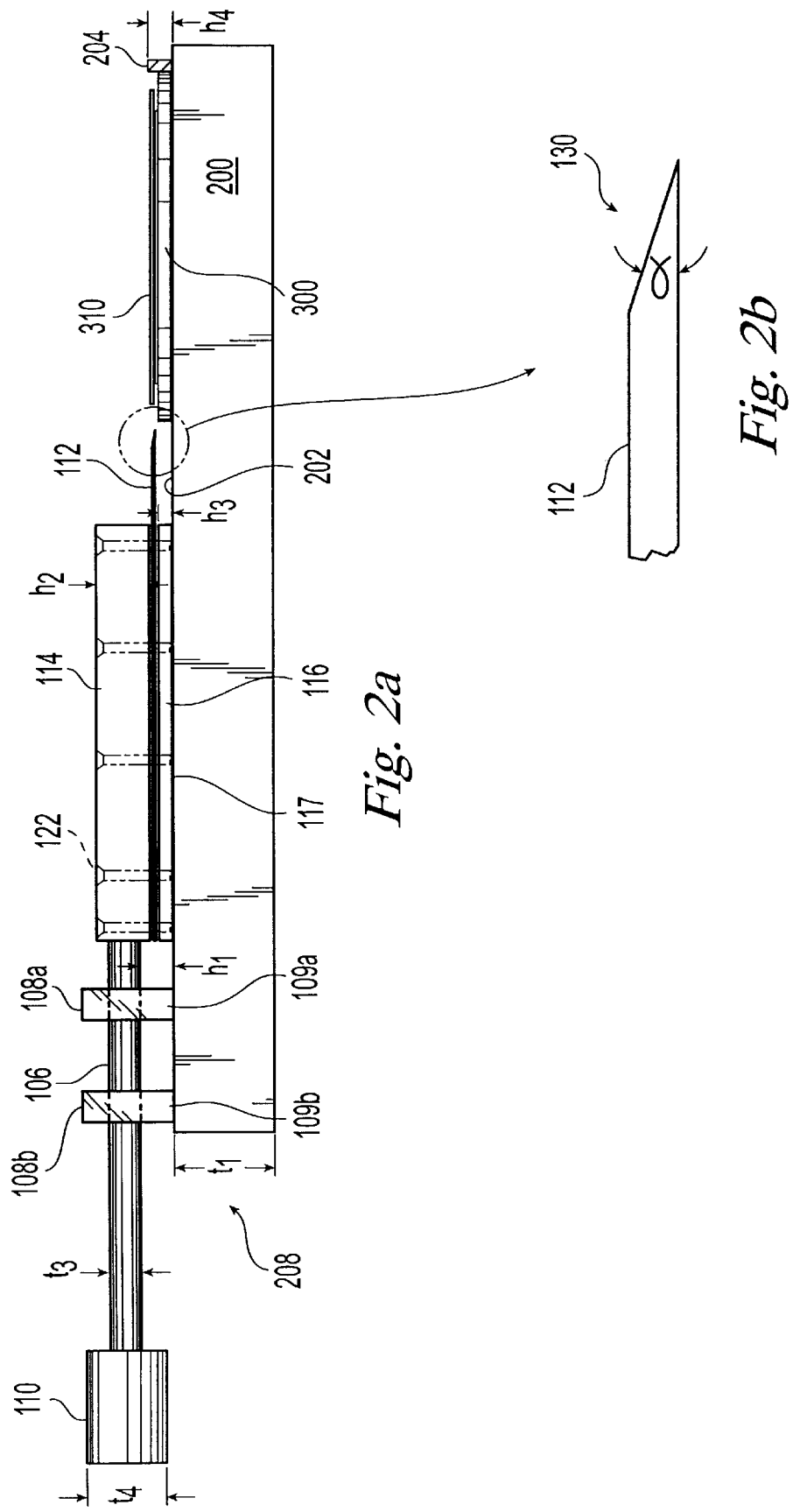

The tray 104 includes a substantially planar wafer support surface 112, a U-shaped upper tray boundary member 114 having a height h2 and a U-shaped lower tray support member 116 having a height h3. As seen in FIGS. 1 and 2, the thickness t2 of the U-shaped tray members and the heights h2 and h3 are sufficient to provide the planar wafer support surface 112 with structural rigidity so as to prevent significant torsional deformation. In a preferred embodiment t2 is 1.0–1.5 cm in thickness, h2 is between 5–7.5 mm in height and h3 is approximately 1.25–1.75 mm in height, although other thicknesses and heights may also suffice. The U-shaped upper tray boundary member 114 comprises upstanding boundary walls including parallel first 118a and second 118b side walls and a back wall 120. The U-shaped lower tray support member 116 has a similar construction and is provided with a lower tray support surface 117. It should be noted here that instead of having unitary construction, the U-shaped tray boundary members 114, 116 may each comprise individual side and back walls. Regardless of their construction, screws 122 or other fasteners are preferably used to fasten the upper and lower members with the wafer support surface 112.

The wafer support surface 112 preferably is formed as a thin, rigid membrane between 2–4 mil in thickness. The wafer support surface 112 has a leading end portion 124 comprising first and second operative front edges 126a, 126b which extend outwardly in a direction away from the handle 102 to meet at a rounded apex 128. The wafer support surface, preferably is thicker near the operative front edges and thinner near its central portion. As seen in FIG. 2b, the operative front edges, especially at the apex, are provided with a bevel 130 having an angle α which preferably is between 20–40°, more preferably is between 25°–35° and most preferably is about 30°. The bevel 130 is used to help the front of the wafer support surface 112 demount the wafer 310 from the carrier 300 by easing under the bottom surface of the wafer, thereby lifting an edge of the wafer thereonto.

The interior A width of the wafer support surface 112 in the region between the side walls 118a, 118b has a dimension w1, which is sufficient to accommodate the width of a semiconductor wafer of standard size. Thus, in the spatula designed to hold an 8 inch wafer, w1 preferably is no greater than about 8.5 inches. Similarly, in a spatula designed to hold 12 inch wafers, w1 preferably is no greater than about 12.5 inches. It is understood, however, that w1 may take on other lengths for either size wafer. The interior length w2 of the wafer support surface is large enough to accommodate the corresponding size wafer.

The shaft 106, the wafer support surface 112, and the upper 114 and lower 116 U-shaped members are all preferably formed from the same material so that each member undergoes a substantially similar expansion or contraction in response to temperature changes. Preferably, the material is non-magnetic, non-brittle, and can withstand temperatures up to 150° C. In a preferred embodiment, these members are formed from stainless steel, although other materials may also be used.

Figure 4:
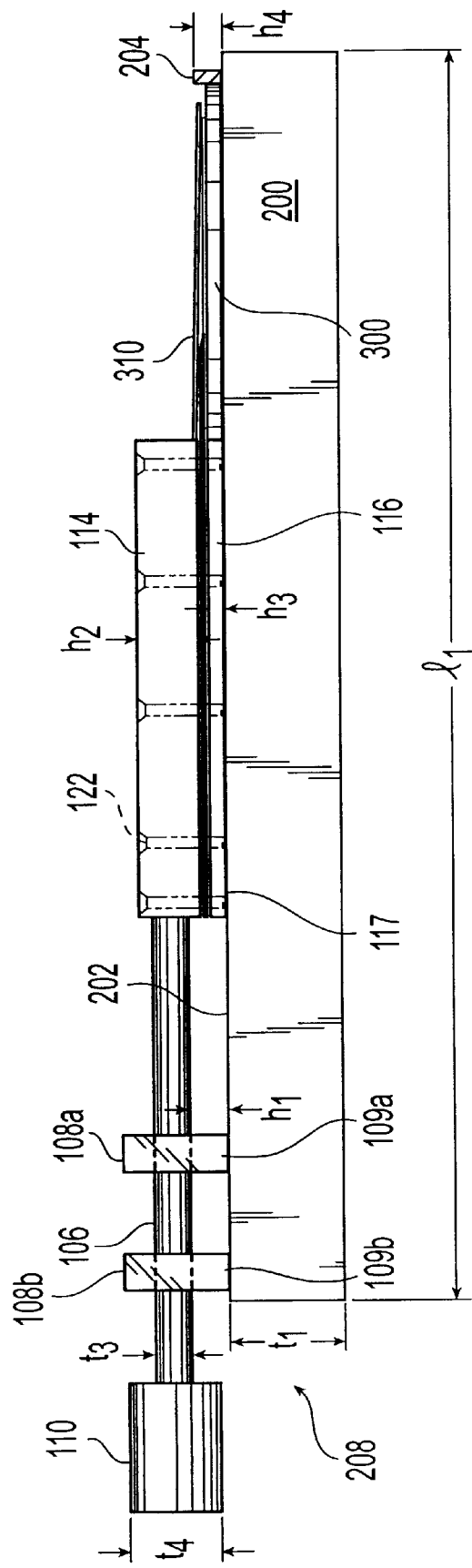
FIG. 4 shows a side view of the spatula, wafer and carrier of FIG. 3.

A semiconductor wafer 310, such as a GaAs wafer, held on a wafer carrier 300 by an adhesive is processed through a number of steps. Once wafer processing is completed, the wafer must be demounted from the wafer carrier 300. For this, the wafer carrier 300 is placed on the base plate 200 and the temperature of the base plate 200 is then is raised to soften the adhesive between the wafer carrier 300 and the wafer 310. The height of the lowermost portion of the front edges of the wafer support surface 112 is approximately the same as the height of the wafer carrier 300 placed on the base plate. This is accomplished by providing that the height h3 of lower U-shaped member 116 is approximately the same as the height of the wafer carrier 300 relative to said substantially planar upper surface 202. The user of the spatula 100 then uses the thermally insulated grip 110 to push the spatula 100 towards the carrier 300. The front edges 126a, 126b of the spatula ease just above the upper surface of the wafer carrier 300 such that the beveled edge 130 first opens, and then enters, a separation gap between the wafer 310 and the wafer carrier 300. This causes the wafer 310 to separate from the wafer carrier 300 and climb onto the wafer support surface 112 as shown in FIGS. 3 and 4. The lifted wafer can then be removed by a vacuum wand or another suitable method known to those skilled in the art.

Furthermore, the height h4 of the base plate stop 204 is taller than a corresponding height of said wafer support surface 112 relative to said substantially planar upper surface 202, when the spatula is placed on the base plate 200. Thus, base plate stop 204 prevents the spatula from pushing the carrier 300 off of the base plate, while the stop's concave surface helps prevent damage to the carrier's side.

Finally, while the above invention has been described with reference to certain preferred embodiments, it should be kept in mind that the scope of the present invention is not limited to these. One skilled in the art may find variations of these preferred embodiments which, nevertheless, fall within the spirit of the present invention, whose scope is defined by the claims set forth below.

What is claimed is:

1. A wafer removing spatula comprising:
    a handle having a shaft provided with a first and a second end, the shaft having slidably mounted thereon at least one support guide between said first and second ends, the at least one support guide having a bottom post surface configured and dimensioned to allow longitudinal movement of said spatula along its shaft, when said bottom post surface is fixed to a mounting surface;
    a tray connected to the first end of the handle, the tray including a substantially planar wafer support surface defining a plane, an upper tray boundary member projecting above the wafer support surface and partially surrounding a perimeter thereof, and a lower tray support member configured and dimensioned to retain the wafer support surface substantially parallel to a mounting surface on which said lower tray support member rests, as the spatula is moved longitudinally along its shaft; and
    a thermally insulating grip connected to the second end of said shaft member, the thermally insulating grip having an abutment surface which extends below the plane of the wafer support surface, when the spatula is oriented such that the wafer support surface is horizontal.

2. The spatula according to claim 1, wherein said wafer support surface, upper tray boundary member, lower tray support member and said shaft are all formed from a same material.

3. The spatula according to claim 2, wherein said material is stainless steel.

4. The spatula according to claim 1, comprising a pair of spaced apart support guides arranged along said shaft, each support guide being provided by with a corresponding bottom post surface.

5. The spatula according to claim 1, wherein a front end of the wafer support surface is provided with first and second operative edges converging in direction away from the handle member and meeting at an apex.

6. The spatula according to claim 5, wherein the first and second operative edges are provided with a beveled edge configured and dimensioned to facilitate lifting a wafer from a carrier.

7. The spatula according to claim 5, wherein the apex is rounded, having a radius of curvature between 75–85 mm.

8. The spatula according to claim 1, wherein a front end of the wafer support surface is provided with at least one beveled edge configured and dimensioned to facilitate lifting a wafer from a carrier.

9. The spatula according to claim 1, further comprising a plurality of screws joining together the wafer support surface, the upper tray boundary member, and the lower tray support member.

10. A wafer removing assembly comprising:
    a base plate having a substantially planar mounting surface; and
    a wafer removing spatula comprising:
        a handle having a shaft provided with a first and a second end, the shaft having slidably mounted thereon at least one support guide between said first and second ends, the at least one support guide having a bottom post surface configured and dimensioned to allow longitudinal movement of said spatula along its shaft, when said bottom post surface is fixed to said substantially planar mounting surface;
        a tray connected to the first end of the handle, the tray including a substantially planar wafer support surface defining a plane, an upper tray boundary member projecting above the wafer support surface and partially surrounding a perimeter thereof, and a lower tray support member configured and dimensioned to retain the wafer support surface substantially parallel to said substantially planar mounting surface, as the spatula is moved longitudinally along its shaft; and
        a thermally insulating grip connected to the second end of said shaft member, the thermally insulating grip having an abutment surface which extends below the plane of the wafer support surface, when the spatula is oriented such that the wafer support surface is horizontal.

11. The wafer removing assembly according to claim 10, further comprising:
    an upstanding stop provided at a first end of said base plate, the upstanding stop having a height taller than a height of said wafer support surface.

* * * * *